United States Patent
Huang et al.

(10) Patent No.: US 10,096,745 B1
(45) Date of Patent: Oct. 9, 2018

(54) LIGHT EMITTING DIODE CAPABLE OF GENERATING DIFFERENT LIGHT COLORS OVER SINGLE WAFER

(71) Applicant: EXCELLENCE OPTO. INC., Miaoli County (TW)

(72) Inventors: Kuo-Hsin Huang, Miaoli County (TW); Chun-Der Wu, Miaoli County (TW); Tzeng-Guang Tsai, Miaoli County (TW); Kuo-Shu Tseng, Miaoli County (TW)

(73) Assignee: EXCELLENCE OPTO, INC., Miaoli County, Hsinchu Science Park (TW)

( * ) Notice: Subject to any disclaimer, the term of this patent is extended or adjusted under 35 U.S.C. 154(b) by 0 days.

(21) Appl. No.: 15/608,584

(22) Filed: May 30, 2017

(30) Foreign Application Priority Data

Mar. 27, 2017 (TW) .............................. 106204258 U

(51) Int. Cl.
*H01L 33/08* (2010.01)
*H01L 33/50* (2010.01)
*H01L 33/00* (2010.01)
*H01L 33/48* (2010.01)

(52) U.S. Cl.
CPC .......... *H01L 33/08* (2013.01); *H01L 33/0079* (2013.01); *H01L 33/50* (2013.01); *H01L 33/48* (2013.01)

(58) Field of Classification Search
CPC ...... H01L 33/08; H01L 33/50; H01L 33/0079; H01L 33/48
See application file for complete search history.

(56) References Cited

U.S. PATENT DOCUMENTS 8,390,193 B2 * 3/2013 Li ........................... F21S 10/02
313/506
8,569,083 B2 10/2013 Lu et al.

* cited by examiner

*Primary Examiner* — David Vu
(74) *Attorney, Agent, or Firm* — Muncy, Geissler, Olds & Lowe, P.C.

(57) ABSTRACT

A wafer substrate, a light emitting diode (LED) light-emitting layer, a circuit layer and an excitation material layer are included. The LED light-emitting layer includes at least two light-emitting regions, independently distinguished. The circuit layer includes at least two circuit structures that correspond to the at least two light-emitting regions in quantity and are independently controlled. The excitation material layer includes at least one photo-luminescence material, at least one of the at least two light-emitting regions is provided with different photo-luminescence materials, and at least one of the at least two light-emitting regions is not provided with the photo-luminescence material. Accordingly, in the present invention, at least two light colors can be formed over a single wafer substrate through the at least two independently-controlled circuit structures and providing the different photo-luminescence materials.

4 Claims, 4 Drawing Sheets

LIGHT EMITTING DIODE CAPABLE OF GENERATING DIFFERENT LIGHT COLORS OVER SINGLE WAFER

FIELD OF THE INVENTION

The present invention relates to a light source structure of a light emitting diode (LED), and more particularly to an LED structure capable of generating different light colors over a single wafer.

BACKGROUND OF THE INVENTION

A light emitting diode (LED) is a luminescence assembly. A luminescence principle thereof is to exert a forward bias voltage (current) on a III-V compound semiconductor material, and to utilize a form of combining electrons and electron holes in the LED with each other and converting energy into light, where light can be emitted during energy release and the LED will not be as hot as an incandescent lamp bulb after being used for a long time. The LED is advantageous in small size, long life, low drive voltage, high response rate and excellent seismic resistance, can meet demands for various lightweight, thin and miniaturized devices, and has become a product popularized in daily life.

Referring to FIG. 1 and FIG. 2, LEDs may be mainly divided into a vertical-type LED (FIG. 1) and a horizontal-type LED (FIG. 2) according to different drive structures (electrode structures). The LED structurally comprises a wafer substrate 1, an LED light-emitting layer 2 and a circuit layer 3, the wafer substrate 1 being divided into a conductive (vertical-type LED) substrate and a non-conductive (horizontal-type LED) substrate, and adopting a silicon substrate, a sapphire substrate, etc.

The LED light-emitting layer 2 comprises a first-type semiconductor layer 2a, a light-emitting layer 2b and a second-type semiconductor layer 2c, constituting a sandwich structure. The first-type semiconductor layer 2a may adopt an N-type semiconductor layer or a P-type semiconductor, and the second-type semiconductor layer 2c may adopt a P-type semiconductor layer or an N-type semiconductor correspondingly. The light-emitting layer 2b is made of a III-V compound material, which may be selected according to a wavelength to be emitted. The circuit layer 3 comprises a first-type electrode 3a and a second-type electrode 3b, which may be provided on the same side of the LED light-emitting layer 2 (horizontal-type LED) separately or two sides of the LED light-emitting layer 2 (vertical-type LED). Accordingly, after a voltage is exerted between the first-type electrode 3a and the second-type electrode 3b, an electron and an electron hole may be provided respectively, the electron and the electron hole may be combined inside the light-emitting layer 2b, and can further jump by steps to generate exciting light.

The current light-emitting performance and efficiency of the LED are increasingly advanced, a great variety of LEDs can be widely applied to daily life, an LED capable of emitting light having various colors such as red, orange, yellow, green, blue and purple as well as invisible light such as infrared light and ultraviolet light can be designed by utilizing the changes of various compound semiconductor materials and assembly structures, and various LEDs have been widely applied to outdoor advertising boards, stop lamps, traffic lights, displays, etc.

At present, LED chips are of a single light-emitting wavelength range specification, a packaging factory will package this chip of the single light-emitting wavelength range specification or needs to package two or more chips within different light-emitting wavelength ranges into an identical packaging body, the completed packaging bodies are arranged and assembled as required, a single chip or a single LED assembly is controlled by a control circuit, and LEDs having different light-emitting wavelengths generate mixed light to than a full-color display picture effect. But the prior art and structure will generate a large clearance between LEDs, thus being adverse to miniaturization.

Due to variation influences of manufacturing procedures and materials, main wavelength distributions of LED chips produced in each batch are different. When light having specific wavelength characteristics needs to be emitted, demands of light emission in different lighting occasions need to be met or a specific color for full-color display needs to be formed, in order to meet requirements for color accuracy, the earliest prior art refers to: binning many LED grains by utilizing spot measurement, sorting and binning programs to sort out LED grains close to the main wavelength distributions to result in considerable cost and time consumption of applications having different wavelength characteristic demands.

Therefore, an American patent filed U.S. Pat. No. 8,569,083 B2 discloses a structure having a plurality of light-emitting layers 22 over a substrate, a wavelength conversion convergence layer and a wavelength conversion layer are stacked in sequence, and light emitted by the plurality of light-emitting layers 22 is absorbed and converted through the wavelength conversion convergence layer and the wavelength conversion layer to make main wavelengths of finally-emitted light relatively consistent. Thus, a procedure of sorting and binning and then rearrangement according to main wavelength distribution in a known LED array grain manufacturing process is omitted, and production costs can be reduced.

However, repeated wavelength conversion results in that the utilization efficiency of light is low, the phenomenon of high heat is easily caused, miniaturization is difficult to achieve and high-brightness demands cannot be met. Moreover, a multi-layer stacking structure will increase manufacturing costs and reduce manufacturing yields, and demands in use are difficult to meet.

SUMMARY OF THE INVENTION

To this end, the present invention is mainly intended to provide an LED capable of generating different light colors over a single wafer, which can adjust light intensities of different light colors as required and enables a color temperature of mixed light to meet demands in use.

The present invention provides an LED capable of generating different light colors over a single wafer, which comprises a wafer substrate, an LED light-emitting layer, a circuit layer and an excitation material layer, the LED light-emitting layer being provided on the wafer substrate. The LED light-emitting layer has at least two light-emitting regions, independently distinguished. The circuit layer provides a forward bias voltage for the LED light-emitting layer, and the circuit layer has at least two circuit structures that correspond to the at least two light-emitting regions in quantity and are independently controlled. The excitation material layer covers the LED light-emitting layer, the excitation material layer has at least one photo-luminescence material, at least one of the at least two light-emitting regions is provided with the photo-luminescence material, at least one of the at least two light-emitting regions is not provided with the photo-luminescence material, and light having two wavelengths (provided with the photo-luminescence material and not provided with the photo-luminescence material) may be emitted at least.

Or, on the premise of covering the LED light-emitting layer with the excitation material layer, the excitation material layer has at least two photo-luminescence materials, at least two different photo-luminescence materials are provided on the at least two light-emitting regions, and light having two wavelengths may be emitted at least likewise.

Accordingly, in the present invention, a manner of providing the photo-luminescence material is adopted, and the at least two independently-distinguished light-emitting regions and the at least two independently-controlled circuit structures are cooperatively adopted, so light having two wavelengths may be emitted at least. Furthermore, by independently controlling the at least two circuit structures, light intensities of the light having two wavelengths can be further slightly adjusted to adjust color temperatures. Moreover, the circuit structures are provided on the single wafer substrate, processing and manufacturing can be completed at the same time, miniaturization can be achieved, manufacturing costs can be reduced, and demands in use can be met.

DETAILED DESCRIPTION OF THE PREFERRED EMBODIMENTS

In order to make a member further understand and accept features, purposes and effects of the present invention, descriptions will be made with reference to a preferable embodiment and in conjunction with the drawings as follows.

Figure 1:
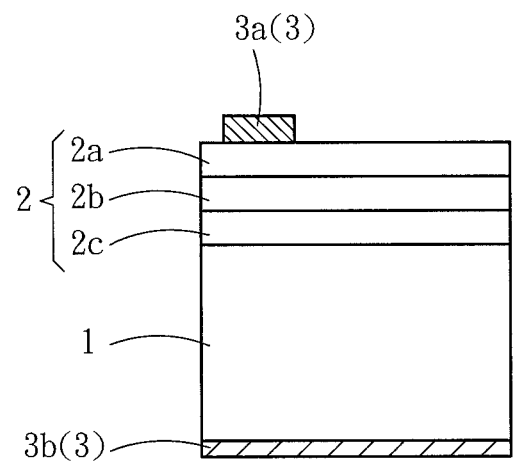
FIG. 1 is an optical structure diagram of a known vertical-type LED.
Figure 2:
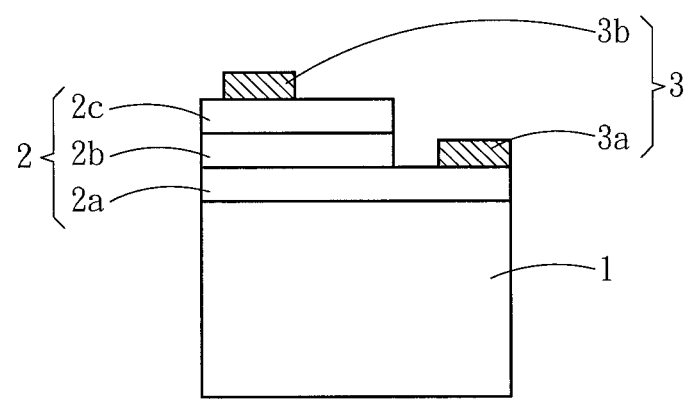
FIG. 2 is an optical structure diagram of a known horizontal-type LED.
Figure 3:
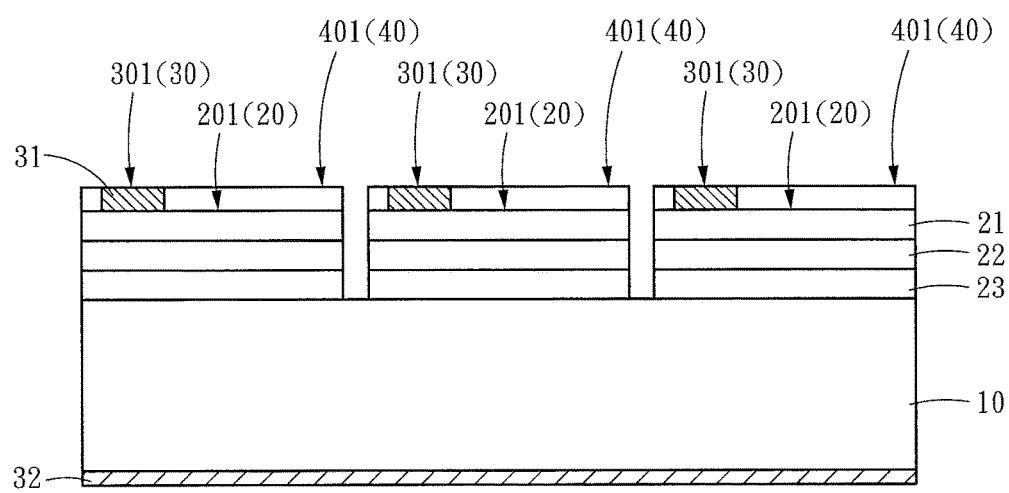
FIG. 3 is an optical structure diagram of a first embodiment of the present invention.

Referring to FIG. 3, FIG. 3 is an optical structure diagram of a first embodiment of the present invention. The structure is illustrated with a vertical-type LED. The structure is an LED light-emitting layer structure capable of generating different light colors over a single wafer, which comprises a wafer substrate 10, an LED light-emitting layer 20, a circuit layer 30 and an excitation material layer 40. In the present embodiment, the wafer substrate 10 is conductive and may adopt a silicon substrate.

The LED light-emitting layer 20 is provided on the wafer substrate 10, the LED light-emitting layer 20 includes at least two light-emitting regions 201, independently distinguished, and the LED light-emitting layer 20 may include a first-type semiconductor layer 21, a light-emitting layer 22 and a second-type semiconductor layer 23. The first-type semiconductor layer 21 may adopt an N-type semiconductor layer or a P-type semiconductor, and the second-type semiconductor layer 23 may adopt a P-type semiconductor layer or an N-type semiconductor correspondingly.

The circuit layer 30 provides a forward bias voltage for the LED light-emitting layer 20, the circuit layer 30 includes at least two circuit structures 301 that correspond to the at least two light-emitting regions 201 in quantity and are independently controlled, and the at least two circuit structures 301 may include a second-type electrode 32 and a first-type electrode 31 respectively. The second-type electrode 32 is provided below the wafer substrate 10, and the first-type electrode 31 is provided over the semiconductor layer 21.

The excitation material layer 40 covers the LED light-emitting layer 20, the excitation material layer 40 includes at least two photo-luminescence materials 401, and at least two different photo-luminescence materials 401 are provided on the at least two light-emitting regions 201.

Figure 4:
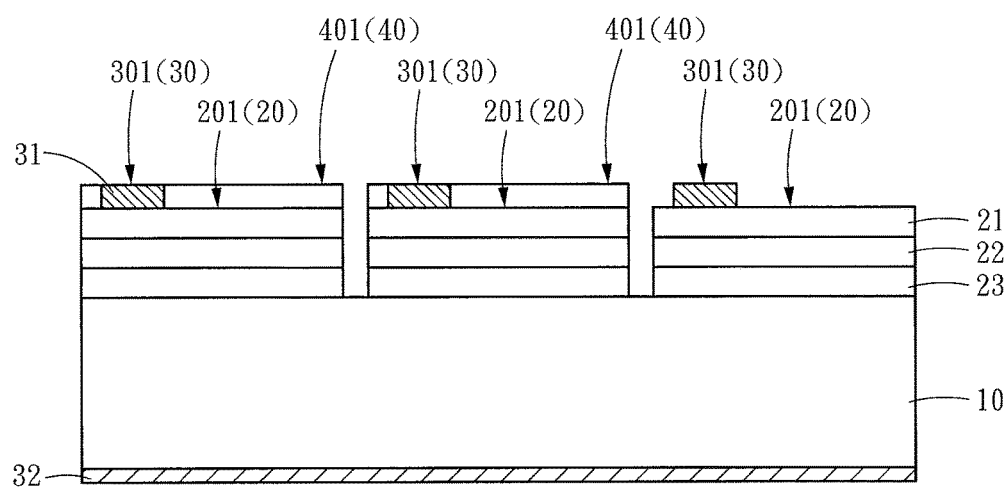
FIG. 4 is an optical structure diagram of a second embodiment of the present invention.

Referring to FIG. 4, FIG. 4 is an optical structure diagram of a second embodiment of the present invention. In the present embodiment, the excitation material layer 40 includes at least one photo-luminescence material 401, at least one of the at least two light-emitting regions 201 is provided with the photo-luminescence material 401, and at least one of the at least two light-emitting regions 201 is not provided with the photo-luminescence material 401. Different from the first embodiment, the present embodiment is characterized in that the excitation material layer 40 does not cover the at least one LED light-emitting layer 20, and when there are two or more light-emitting regions 201 provided with the photo-luminescence material 401, different photo-luminescence materials 401 may be provided respectively.

Figure 5:
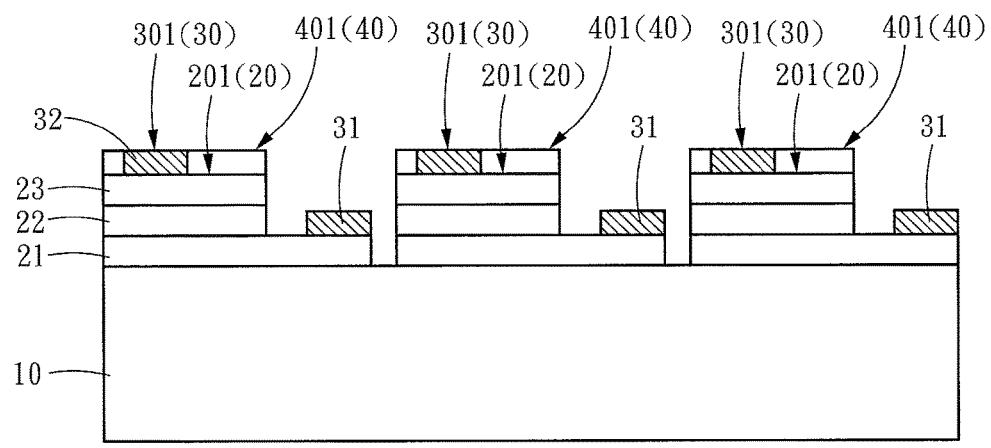
FIG. 5 is an optical structure diagram of a third embodiment of the present invention.

Referring to FIG. 5, FIG. 5 is an optical structure diagram of a third embodiment of the present invention. The structure is illustrated with a horizontal-type LED. Different from the first embodiment, the present embodiment is characterized in that the wafer substrate 10 is not limited to a highly-conductive material, and therefore a silicon substrate may be adopted; the first-type semiconductor layer 21 is provided on the wafer substrate 10, and the first-type semiconductor layer 21 is exposed to allow provision of the first-type electrode 31. That is, regions of the light-emitting layer 22 and the second-type semiconductor layer 23 will be drawn back, and in addition, the second-type electrode 32 is provided on the second-type semiconductor layer 23.

Figure 6:
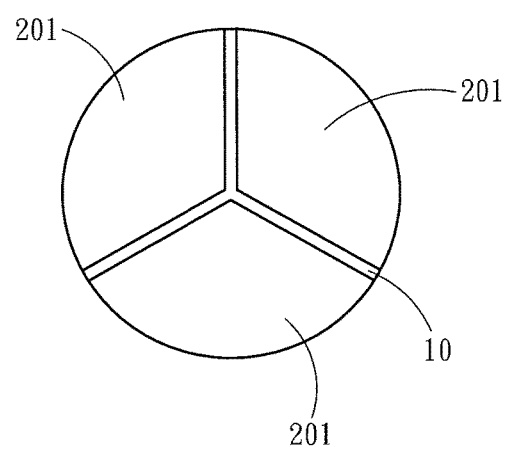
FIG. 6 is an independent distinguishing diagram 1 of an LED light-emitting layer of the present invention.
Figure 7:
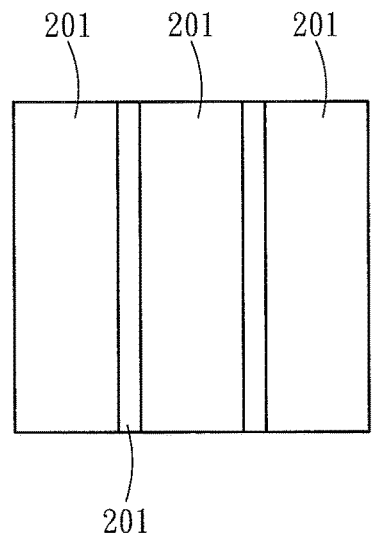
FIG. 7 is an independent distinguishing diagram 2 of an LED light-emitting layer of the present invention.
Figure 8:
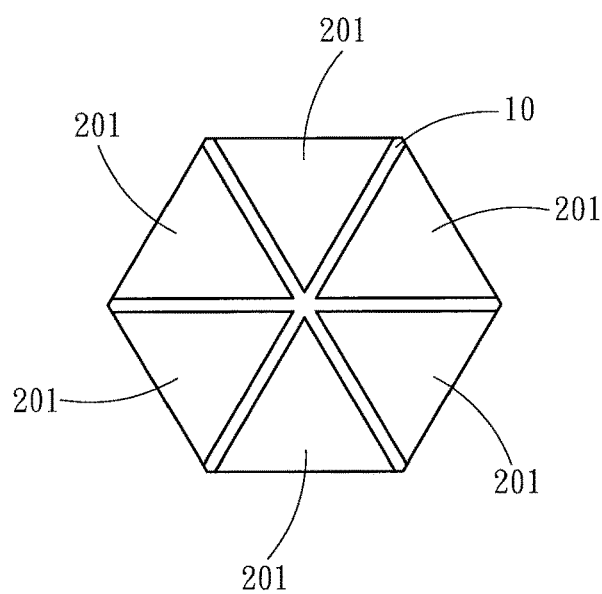
FIG. 8 is an independent distinguishing diagram 3 of an LED light-emitting layer of the present invention.

Referring to FIG. 6, FIG. 7 and FIG. 8, a combined appearance of the at least two light-emitting regions 201 may be of multiple shapes that can be set according to practical use demands, and the two light-emitting regions 201 may be of any one of a fan shape (as shown in FIG. 6), a rectangle (as shown in FIG. 7) and a polygon (as shown in FIG. 8).

As above, compared with the prior art, the present invention has, at least advantages as follows.

1. A manner of providing the photo-luminescence material is adopted, and the at least two independently-distinguished light-emitting regions and the at least two independently-controlled circuit structures are cooperatively adopted, so light having two wavelengths may be emitted at least.

2. By independently controlling the at least two circuit structures, light intensities of the light having two wavelengths can be further slightly adjusted to adjust color temperatures so as to make wavelengths consistent.

3. The circuit structures are provided on the single wafer substrate, processing and manufacturing can be completed at the same time, miniaturization can be achieved, manufacturing costs can be reduced, and demands in use can be met.

What is claimed is:

1. A light emitting diode (LED) light-emitting layer structure capable of generating different light colors over a single wafer, comprising:
- a wafer substrate;
- an LED light-emitting layer provided on the wafer substrate, the LED light-emitting layer having at least two light-emitting regions, independently distinguished;
- a circuit layer providing a forward bias voltage for the LED light-emitting layer, the circuit layer having at least two circuit structures that correspond to the at least two light-emitting regions in quantity and are independently controlled; and
- an excitation material layer covering the LED light-emitting layer, the excitation material layer having at least two photo-luminescence materials, and at least two different photo-luminescence materials being provided on the at least two light-emitting regions.

2. The LED light-emitting layer structure capable of generating different light colors over a single wafer according to claim 1, wherein the wafer substrate is conductive, the LED light-emitting layer includes a first-type semiconductor layer, a light-emitting layer and a second-type semiconductor layer, the at least two circuit structures include a second-type electrode and a first-type electrode respectively, the second-type electrode is provided below the wafer substrate, and the first-type electrode is provided over the first-type semiconductor layer.

3. The LED light-emitting layer structure capable of generating different light colors over a single wafer according to claim 1, wherein the LED light-emitting layer includes a first-type semiconductor layer, a light-emitting layer and a second-type semiconductor layer, the at least two circuit structures include a second-type electrode and a first-type electrode respectively, and the first-type electrode and the second-type electrode are provided on the first-type semiconductor layer and the second-type semiconductor layer respectively.

4. The LED light-emitting layer structure capable of generating different light colors over a single wafer according to claim 1, wherein a combined appearance of the at least two light-emitting regions is of any one of a fan shape, a rectangle and a polygon.

* * * * *

UNITED STATES PATENT AND TRADEMARK OFFICE
CERTIFICATE OF CORRECTION

PATENT NO. : 10,096,745 B1
APPLICATION NO. : 15/608584
DATED : October 9, 2018
INVENTOR(S) : Kuo-Hsin Huang et al.

Page 1 of 1

It is certified that error appears in the above-identified patent and that said Letters Patent is hereby corrected as shown below:

On the Title Page

(73) Assignee:
Delete "EXCELLENCE OPTO, INC. (MIAOLI COUNTY, HSINCHU SCIENCE PARK, TW)"
Insert -- EXCELLENCE OPTO. INC. (MIAOLI COUNTY, HSINCHU SCIENCE PARK, TW) --

Signed and Sealed this
Twenty-fourth Day of September, 2019

Andrei Iancu
*Director of the United States Patent and Trademark Office*